United States Patent
Lie et al.

(10) Patent No.: US 10,167,558 B1
(45) Date of Patent: Jan. 1, 2019

(54) PHASE SHIFTED GAS DELIVERY FOR HIGH THROUGHPUT AND COST EFFECTIVENESS ASSOCIATED WITH ATOMIC LAYER ETCHING AND ATOMIC LAYER DEPOSITION

(71) Applicant: International Business Machines Corporation, Armonk, NY (US)

(72) Inventors: Fee Li Lie, Albany, NY (US); Siva Kanakasabapathy, Pleasanton, CA (US); Eric Miller, Watervliet, NY (US); Hyung Joo Shin, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/782,967

(22) Filed: Oct. 13, 2017

(51) Int. Cl.
| | |
|---|---|
| C23C 16/00 | (2006.01) |
| C23C 16/52 | (2006.01) |
| H01L 21/67 | (2006.01) |
| C23C 16/455 | (2006.01) |

(52) U.S. Cl.
CPC ........ *C23C 16/52* (2013.01); *C23C 16/45534* (2013.01); *C23C 16/45544* (2013.01); *C23C 16/45553* (2013.01); *C23C 16/45561* (2013.01); *H01L 21/67069* (2013.01); *H01L 21/67253* (2013.01); *H01L 21/67167* (2013.01)

(58) Field of Classification Search
CPC . C23C 16/455; C23C 16/45574; C23C 16/52; C23C 16/45553; C23C 16/45561; C23C 16/45534
See application file for complete search history.

(56) References Cited

U.S. PATENT DOCUMENTS

| | | |
|---|---|---|
| 7,694,688 B2 | 4/2010 | Lester et al. |
| 8,895,450 B2 | 11/2014 | Cao et al. |
| 9,196,474 B2 | 11/2015 | Knapp et al. |
| 9,245,744 B2 | 1/2016 | Shanker et al. |

(Continued)

OTHER PUBLICATIONS

Barber et al., "Two Chamber Air to Vacuum Lock System", An IP.com Prior Art Database Technical Disclosure, Driginal Publication Date: Dec. 1, 1968, IP.com No. IPCOM000089896D, 3 pages.

(Continued)

*Primary Examiner* — Kyoung Lee
*Assistant Examiner* — Christina Sylvia
(74) *Attorney, Agent, or Firm* — Monchai Chuaychoo (57) ABSTRACT

An approach to optimizing the throughput in an atomic layer deposition process. The approach charges a first wafer chamber with a first gas from a first storage tank for a first cycle run and determines whether the first cycle run has completed. The approach transfers the first gas from the first wafer chamber to a second wafer chamber and charges the first wafer chamber with a second gas from a second storage tank for a second cycle run and determines whether the second cycle run has completed. The approach transfers the first gas from the second wafer chamber to the first storage tank and transfers the second gas from the first wafer chamber to the second wafer chamber for a third cycle run. The approach determines whether the third cycle run has completed and transfers the second gas from the second wafer chamber to the second storage tank.

20 Claims, 5 Drawing Sheets

(56) References Cited

U.S. PATENT DOCUMENTS

| | | | |
|---|---|---|---|
| 9,353,440 B2 | 5/2016 | Ge et al. | |
| 9,396,956 B1 | 7/2016 | Fukazawa | |
| 2005/0016453 A1* | 1/2005 | Seidel | C23C 16/4412 |
| | | | 118/715 |
| 2007/0266941 A1* | 11/2007 | Marsh | C23C 16/45593 |
| | | | 118/715 |
| 2008/0253948 A1* | 10/2008 | Gatineau | C01G 55/004 |
| | | | 423/22 |
| 2011/0290175 A1 | 12/2011 | Paranjpe et al. | |
| 2012/0210937 A1 | 8/2012 | Thakur et al. | |
| 2014/0127404 A1* | 5/2014 | Yudovsky | C23C 16/4412 |
| | | | 427/248.1 |
| 2015/0376786 A1 | 12/2015 | Yudovsky et al. | |
| 2016/0215392 A1 | 7/2016 | Yudovsky et al. | |

OTHER PUBLICATIONS

Bertone, D., "Atomic layer epitaxy of InP", Cselt, Torino © Paper presented at the 5th Biennial Workshop on Organometallic Vapor Phase Epitaxy, Panama City Beach, USA, Apr. 1991, 4 pages.

Bertone, D., "Atomic Layer Epitaxy of InP", Journal of Electronic Materials, vol. 21, No. 3, 1992, Received Apr. 17, 1991; revised Nov. 5, 1991, 4 pages.

Gupta, et al., "Recent development in 2D materials beyond graphene", Progress in Materials Science 73 (2015) 44-126, © 2015 Published by Elsevier Ltd., Accepted Feb. 24, 2015, 83 pages.

Jensen et al., "SiO2 Deposition System for High Throughput, High Yield and Low Contamination", An IP.com Prior Art Database Technical Disclosure, Original Publication Date: Apr. 1, 1991, IPCOM000120391D, 3 pages.

* cited by examiner

FIG. 7

PHASE SHIFTED GAS DELIVERY FOR HIGH THROUGHPUT AND COST EFFECTIVENESS ASSOCIATED WITH ATOMIC LAYER ETCHING AND ATOMIC LAYER DEPOSITION

BACKGROUND OF THE INVENTION

The present invention relates generally to the field of semiconductor manufacturing and more particularly to phase isolation of atomic level etching and deposition.

The use of quasi-atomic level etching (ALE) and atomic level deposition (ALD) are increasingly becoming prevalent in the semiconductor high volume manufacturing (HVM) industry. These processes involve injection of gases into a process chamber that are mutually exclusive in time domain or as a gas in phase isolation to bias. For example, in a dielectric ALE process, a polymer source such as $C_4F_6$ is injected into the chamber during phase exclusion of RF Bias. In another example, in ALD process, a precursor gas such as $TiCl_4$ and an oxidizer such as $H_2O$ is used in the process.

There are several issues with the current ALE and ALD manufacturing process. One issue is the dead timing. For example, dead timing is delay time between switching the precursor gas to deposition gas. Shutting off any gas has two non-productive yet time-consuming steps such as the "inertia of the valves/flow controllers to shut off the gas" and "purge the gas in the process chamber before turning on the next gas or RF turn on." Another issue is "phase isolation" which plagues atomic layer wafer manufacturing. Phase isolation occurs when there is a mixture of the precursor gas and the deposition gas in equal amount, which prohibits quality layering for deposition. Hence, phase isolation affects the throughput of the manufacturing process on a wafer basis.

Accordingly, a need is required to minimize phase isolation and dead time during the wafer manufacturing process.

SUMMARY

According to an embodiment of the present invention, a method for optimizing atomic layer etching (ALE) and atomic layer deposition (ALD), the method comprising; charging a first wafer chamber with a first gas from a first storage tank for a first cycle run; determining if the first cycle run has completed; responsive to the first cycle run completing, transferring the first gas from the first wafer chamber to a second wafer chamber and charging the first wafer chamber with a second gas from a second storage tank for a second cycle run; determining if the second cycle run has completed; responsive to the second cycle run completing, transferring the first gas from the second wafer chamber to the first storage tank and transferring the second gas from the first wafer chamber to the second wafer chamber for a third cycle run; determining if the third cycle run has completed; and responsive to the third cycle run completing, transferring the second gas from the second wafer chamber to the second storage tank.

DETAILED DESCRIPTION

Embodiments of the present invention recognize that improvements to high volume wafer manufacturing may be made by using a unique system and method for shifting gas delivery. This improvement lies in the invention's ability to minimize dead time on the per wafer basis by using parallel processing and keep wafer chambers with a phase shift in gas injection so as to minimize the number of times a gas is actually shut off. The gases are redirected to consecutive and identical wafer chambers. In addition, the improvement further minimizes the issue with phase isolation with the use of multiple chamber staggered with run phases. For example, the first chamber is using precursor gas while the second chamber (already started its staggered run) is using deposition gas for its second phase (see time sequence 402 of FIG. 4). After some time has passed to the next phase, the first chamber is ready to use the deposition gas and second chamber is ready for the precursor gas. Therefore, instead of dumping or purging those gases, the gases are moved from one chamber to another. The first chamber is now ready for the deposition gas which will be retrieved from chamber two. The second chamber is ready for the precursor gas which will be retrieved from chamber one. Thus, the issue of phase isolation is minimized and downtime is also minimized. It is possible that this methodology can be applied to atomic layer etching process as well. Implementation of embodiments of the invention can take a variety of forms, and exemplary implementation details are discussed subsequently with reference to the Figures.

Figure 1:
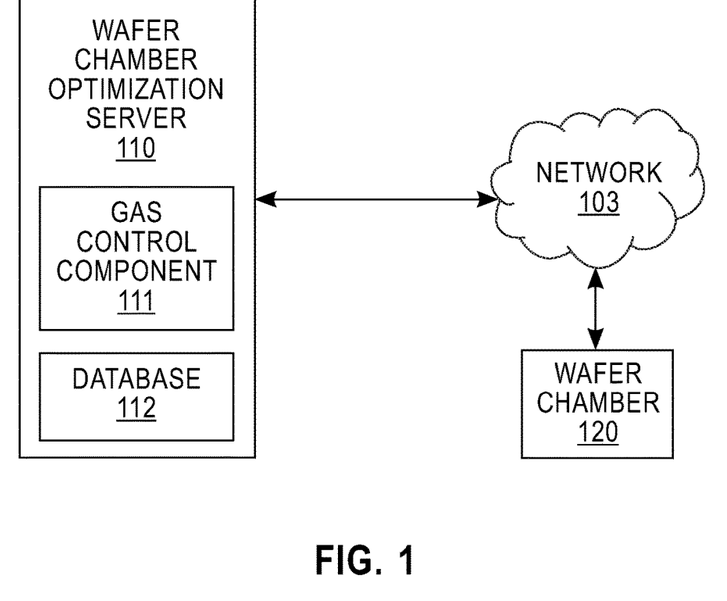
FIG. 1 is a functional block diagram illustrating multi-chamber wafer processing data processing environment, in accordance with an embodiment of the present invention.

FIG. 1 is a functional block diagram illustrating a multi-chamber wafer processing data processing environment, generally designated 100, in accordance with one embodiment of the present invention. FIG. 1 provides only an illustration of one implementation and does not imply any limitations with regards to the environments in which different embodiments may be implemented. Many modifications to the depicted environment may be made by those skilled in the art without departing from the scope of the invention as recited by the claims.

Multi-chamber wafer processing data processing environment 100 includes wafer chamber optimization server 110 and wafer chamber 120, all interconnected over network 103. Network 103 can be, for example, a telecommunications network, a local area network (LAN), a wide area network (WAN), such as the Internet, or a combination of the three, and can include wired, wireless, or fiber optic connections. Network 103 can include one or more wired and/or wireless networks that are capable of receiving and transmitting data, voice, and/or video signals, including multimedia signals that include voice, data, and video information. In general, network 103 can be any combination of connections and protocols that will support communications between wafer chamber optimization server 110, wafer chamber 120, and other computing devices (not shown) within multi-chamber wafer processing data processing environment 100.

Wafer chamber optimization server 110 can be a stand-alone computing device, a management server, a web server, a mobile computing device, or any other electronic device or computing system capable of receiving, sending, and processing data. In other embodiments, wafer chamber optimization server 110 can represent a server computing system utilizing multiple computers as a server system, such as in a cloud computing environment. In another embodiment, wafer chamber optimization server 110 can be a laptop computer, a tablet computer, a netbook computer, a personal computer (PC), a desktop computer, a personal digital assistant (PDA), a smart phone, or any other programmable electronic device capable of communicating with wafer chamber 120, and other computing devices (not shown) within multi-chamber wafer processing data processing environment 100 via network 103. In another embodiment, wafer chamber optimization server 110 represents a computing system utilizing clustered computers and components (e.g., database server computers, application server computers, etc.) that act as a single pool of seamless resources when accessed within multi-chamber wafer processing environment 100. Wafer chamber optimization server 110 includes gas control component 111 and database 112.

Gas control component 111 enables circuit designer to optimize line ends in multi-patterning techniques. In the depicted embodiment, gas control component 111 resides on wafer chamber optimization server 110. In another embodiment, gas control component 111 can reside on wafer chamber 120.

Database 112 is a repository for data used by gas control component 111. In the depicted embodiment, database 112 resides on wafer chamber optimization server 110. In another embodiment, database 112 may reside elsewhere within multi-chamber wafer processing data processing environment 100, provided that gas control component 111 has access to database 112. A database is an organized collection of data. Database 112 can be implemented with any type of storage device capable of storing data and configuration files that can be accessed and utilized by wafer chamber optimization server 110, such as a database server, a hard disk drive, or a flash memory. Database 112 uses one or more of a plurality of techniques known in the art to store a plurality of information of ALE and ALD manufacturing processes. For example, database 112 may store information about precursor gas and deposition time of various gases.

Figure 2:
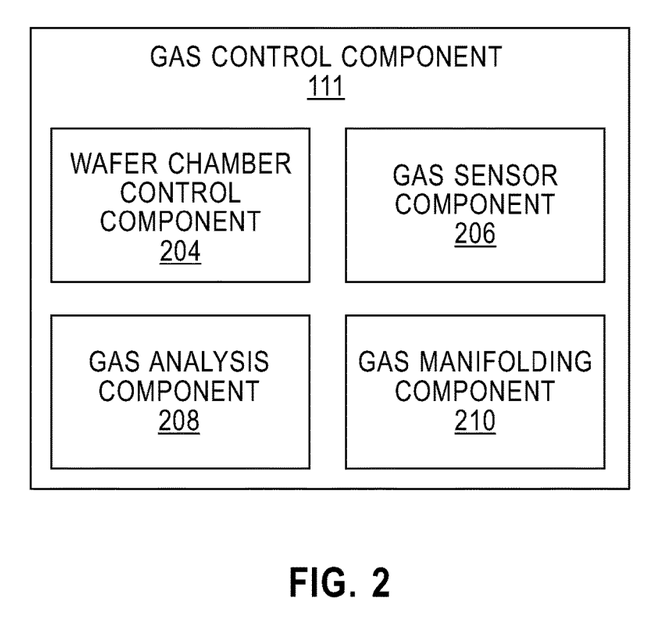
FIG. 2 is a functional block diagram depicting a multi-chamber wafer processing components in accordance with an embodiment of the present invention.

FIG. 2 is a functional block diagram depicting a gas control component comprising wafer chamber control component 204, gas sensor component 206, gas analysis component 208, and gas manifolding component 210.

Wafer chamber control component 204 of the present invention provides the capability to communicate and control the wafer chambers. In an embodiment, wafer chamber control component 204 can control single or multiple identical wafer chambers. For example, wafer chamber control component 204 can control the access to the door mechanism to the chambers. In addition, wafer chamber control component 204 can communicate in real time to all components such as sensors within the wafer chambers. In addition, wafer chamber control component 204 may communicate and control other intermediary piping from the gas source all the way to the dump chamber and trap chamber (e.g., a storage tank) associated with the entire system of the present invention.

Gas sensor component 206 of the present invention provides the capability to detect the presence of various gases in the chamber. In an embodiment, Gas sensor component 204 can determine the ratio of the precursor gas to the deposition gas using various sensors distributed throughout the wafer chamber. Deposition gas can include but is not limited to $Al_2O_3$.

Gas analysis component 208 of the present invention provides the capability to calculate the optimal gases for each wafer run cycle. In an embodiment, gas analysis component 208 receives information about the various gases (e.g., precursor gas and deposition gas) based on gas sensor component 206 required for each run. In addition, gas analysis component 208 receives the type of wafer run (ALE or ALD) and other parameters such as but not limited to the number of wafer chamber needed through wafer chamber control 204 and available quantity of gas supply that will aid in the decision process. After analyzing all the received parameters, gas analysis component 208 determines the optimal ratio and duration for each gas uses during the wafer run for each wafer chamber utilized.

Gas manifolding component 210 of the present invention provides the capability to regulate gas flow into each wafer chamber during a run. In an embodiment, gas manifolding component 210 balances the resistance to gas intake between the two wafer chamber in a hub and spoke pattern from a centralized distribution point (see FIG. 5). The gas flow rates are determined before the run based on the type of run. Additionally, the gas flow rates are time based (e.g., 15 second of the precursor gas at the start of run). In another embodiment, gas manifolding component 210 balances the gas intake between two or more chambers in a nodal hierarchical arrangement where each node serves at least two gas chambers (see FIG. 6). Controlling gas flows (e.g., valves and solenoids, etc.) can be implemented using any existing techniques known in the art. In another embodiment, gas manifolding component 210 may use a volume base process to determine the amount of gas needed for the run instead of using flow rate of the gas.

Figure 3:
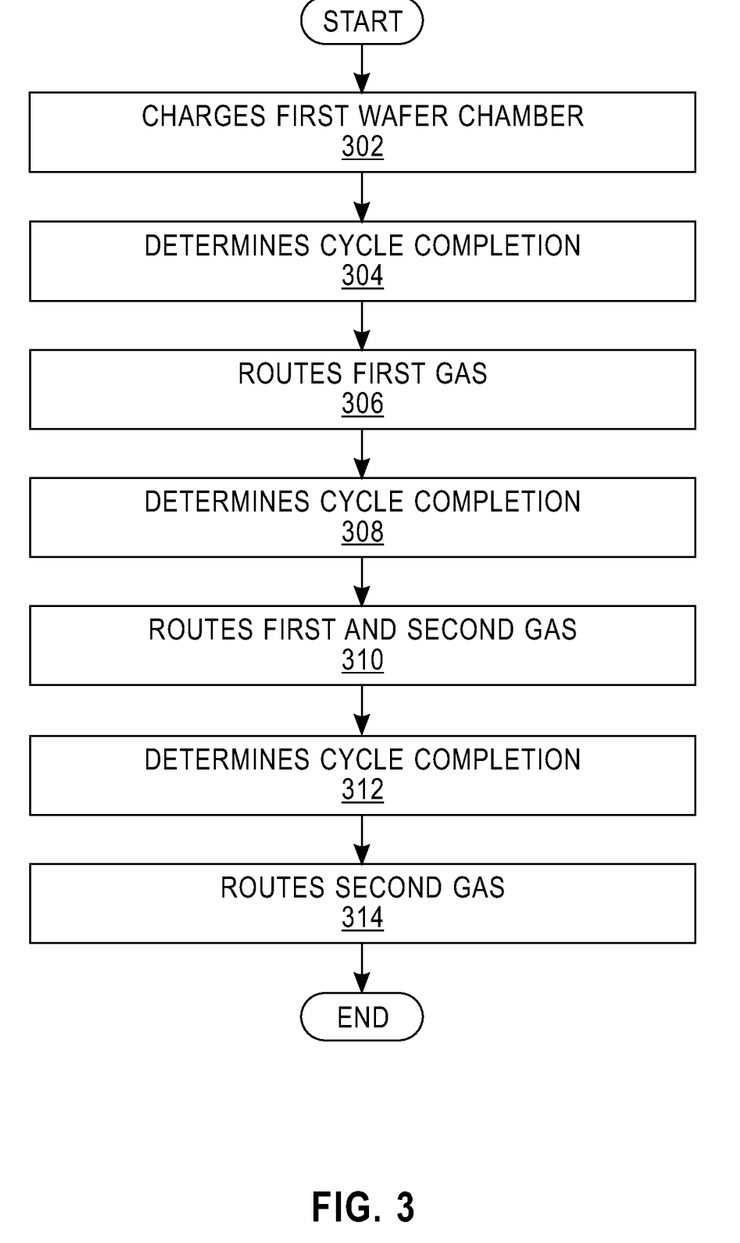
FIG. 3 is a flowchart depicting operational steps of gas control component 111 wafer processing optimization, in accordance with an embodiment of the present invention.

FIG. 3 is a flowchart depicting operational steps of gas control component 111, within multi-chamber wafer processing data processing environment 100 of FIG. 1, in accordance with an embodiment of the present invention.

Gas control component 112 charges the first wafer chamber (step 302). In an embodiment, gas control component 112 analyzes the requirements for the run based on the number of chambers. For example, gas control component 112 through wafer chamber control component 204 and gas sensor component 206 is able to determine the availability and status condition of all wafer chambers for the run. Gas control component 112 through gas analysis component 208 determines the gas required for each wafer chamber. After determining the gas required, gas control component 112 through gas manifolding component 210 "charges" the first chamber with a first gas (e.g., precursor gas). For example, the precursor gas is sent to the first chamber from the first storage tank (e.g., trap/dump unit). Furthermore, the second storage tank may be used to hold the second gas (e.g., deposition gas).

Gas control component 112 determines the cycle completion (step 304). In an embodiment, gas control component 112 through gas analysis component 208, gas sensor component 206 and wafer chamber control component 204 determines if the first cycle of the first gas (e.g., precursor gas) has completed in the first chamber.

Gas control component 112 routes the first gas (step 306). In an embodiment, gas control component 112 through gas manifolding component 210 and wafer chamber control component 204 routes the first gas from the first chamber to the second empty wafer chamber. After routing the gas from the first chamber, gas control component 112 routes the second gas (e.g., deposition gas) from the storage tank to the first chamber to start a second cycle run.

Gas control component 112 determines the cycle completion (step 308). In an embodiment, gas control component 112 through gas analysis component 208, gas sensor component 206 and wafer chamber control component 204 determines if the second cycle of the second gas (e.g., deposition gas) has completed in the first chamber.

Gas control component 112 route the first and second gas (step 310). In an embodiment, gas control component 112 through gas manifolding component 210 and wafer chamber control component 204 routes the first gas from the second chamber to the first storage tank. After routing the gas from to the storage tank, gas control component 112 routes the second gas (e.g., deposition gas) from the first chamber to the second wafer chamber to start a third cycle run.

Gas control component 112 determines the cycle completion (step 312). In an embodiment, gas control component 112 through gas analysis component 208, gas sensor component 206 and wafer chamber control component 204 determines if the third cycle of the second gas (e.g., deposition gas) has completed in the second chamber.

Gas control component 112 routes the second gas (step 314). In an embodiment, gas control component 112 through gas manifolding component 210 and wafer chamber control component 204 routes the second gas from the second chamber to the second storage tank.

Figure 4:
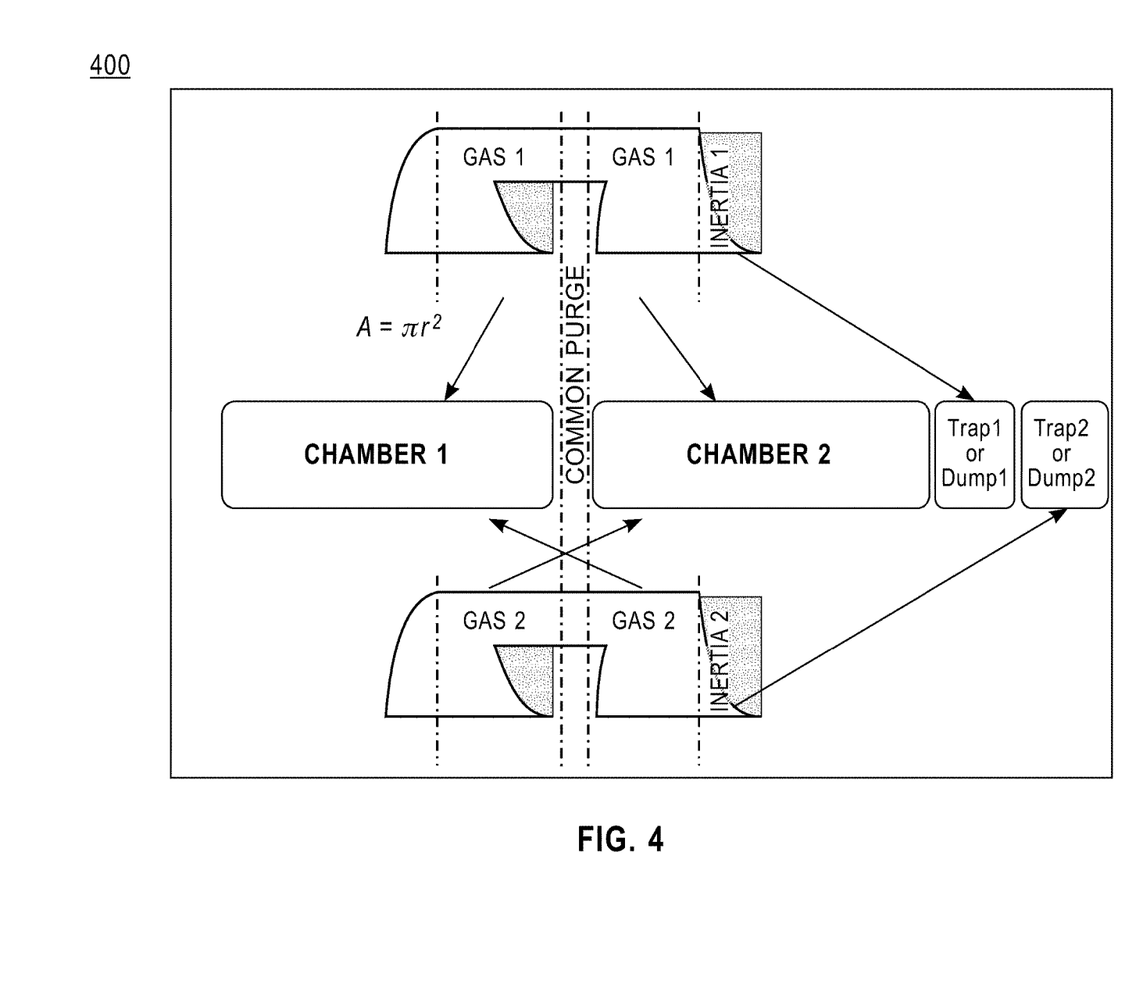
FIG. 4 is a graphical illustration 400 depicting operational steps of a method for multi-chamber wafer processing optimization, in accordance with an embodiment of the present invention.

FIG. 4 depicts the advantage of a parallel processing of gas and graphical sequence of gas flows, in accordance with an embodiment of the present invention.

Graphical sequence 402 (from FIG. 4) illustrates the operational steps mentioned in FIG. 3. For example, chamber one is using precursor gas (Gas 1) while the chamber two (already started its staggered run) is using deposition gas (Gas 2) for its second phase. After a predetermine duration has passed to the next phase ("common purge" section of the illustration), chamber one is ready to use the deposition gas (Gas 2) and chamber two is ready for the precursor gas (Gas 1).

Figure 5:
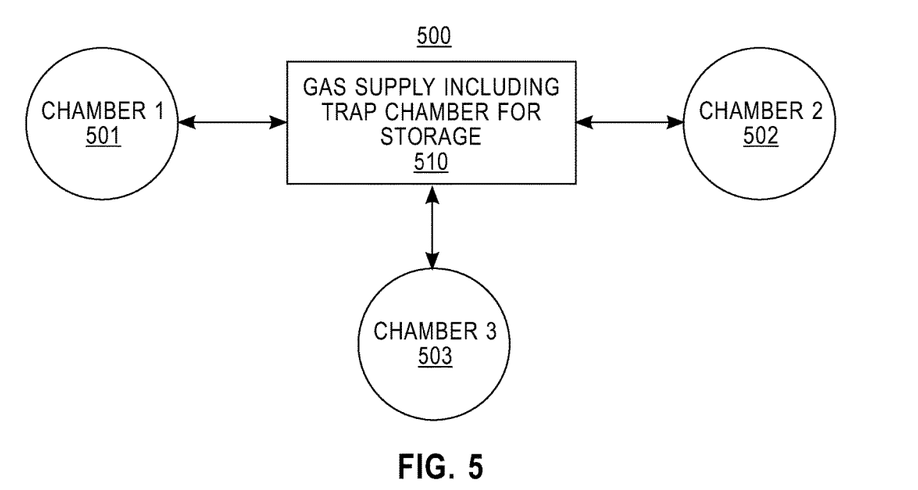
FIG. 5 is a graphical illustration 500 depicting an embodiment of a multi-chamber wafer layout system, in accordance with an embodiment of the present invention.

FIG. 5 depicts hub and spoke model 501, in accordance with an embodiment of the present invention. Hub and spoke model 501 is one embodiment of the present invention. It is noted that a trap/dump chamber (e.g., a storage tank) can be used in the hub and spoke instead of a third wafer chamber. There is no upper limit on number of wafer chambers utilized in this embodiment.

Figure 6:
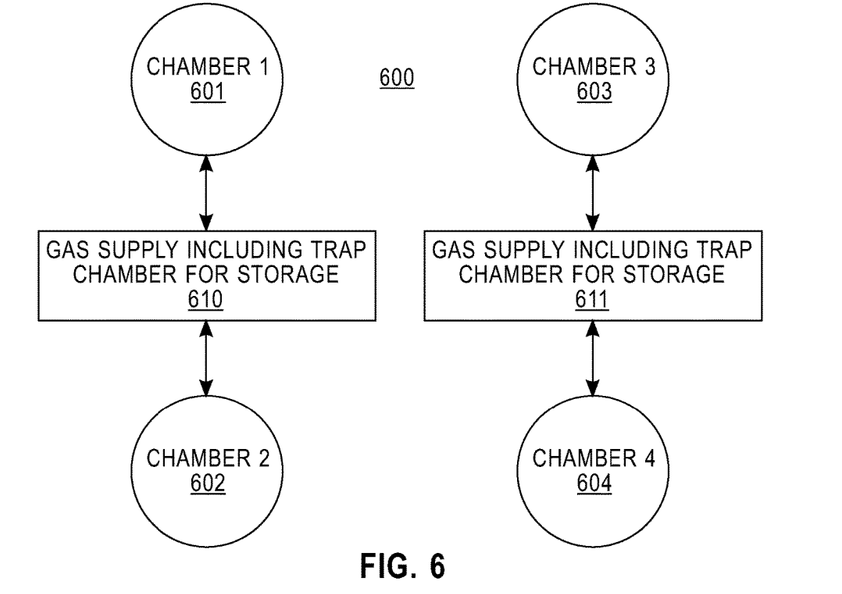
FIG. 6 is a graphical illustration 600 depicting another embodiment of a multi-chamber wafer layout system, in accordance with an embodiment of the present invention.

FIG. 6 depicts a nodal hierarchy arrangement of multiple wafer chambers, in accordance with another embodiment of the present invention. In this alternate embodiment, chamber 1 and chamber 3 are in phase (same cycle), using the same gases for deposition while chamber 2 and chamber 4 are on staggered cycle, using another gas. Once, that cycle has completed then the gas from chamber 1 and chamber 3 will be "swapped" with chamber 2 and chamber 4. Swapping may consist of routing the gas to a trap/dump chamber first (e.g., a storage tank) before actually transferring the gas directly to the waiting chamber. There is no upper limit on number of wafer chambers utilized in this embodiment.

Figure 7:
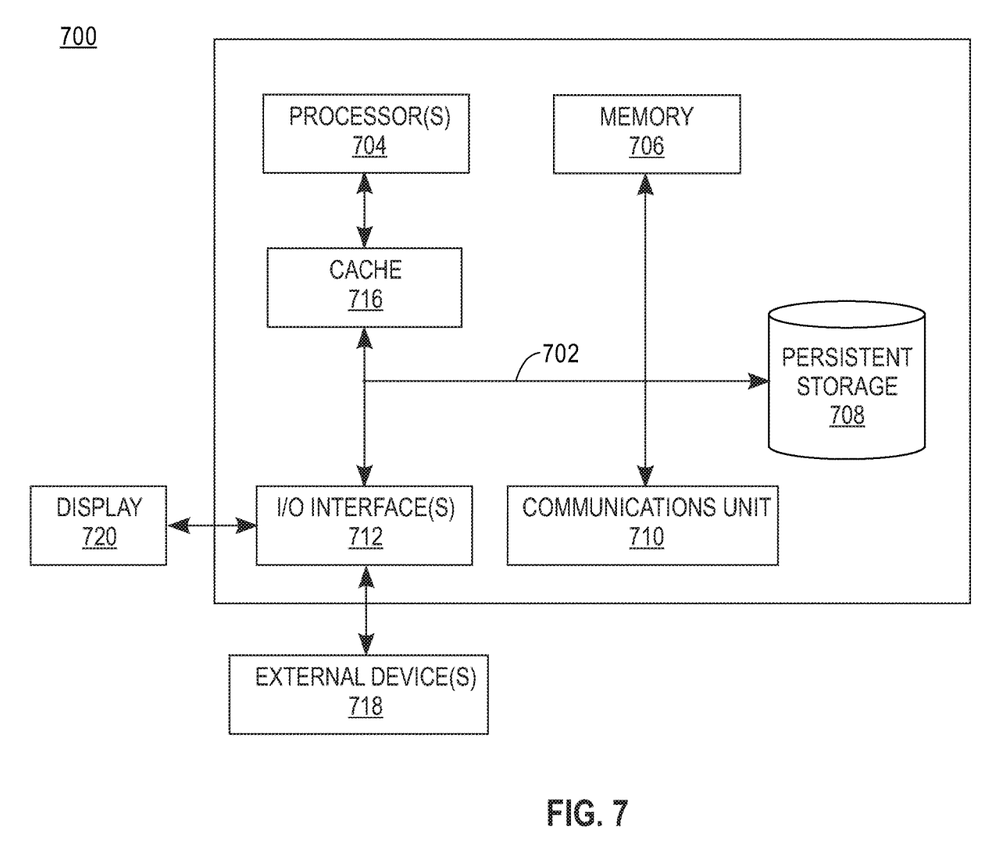
FIG. 7 depicts a block diagram of components of the server computer executing the program within the multi-chamber wafer processing data processing environment of FIG. 1, in accordance with an embodiment of the present invention.

FIG. 7 depicts a block diagram of components of wafer chamber optimization server 110 within multi-chamber wafer processing data processing environment 100 of FIG. 1, in accordance with an embodiment of the present invention. It should be appreciated that FIG. 7 provides only an illustration of one implementation and does not imply any limitations with regard to the environments in which different embodiments can be implemented. Many modifications to the depicted environment can be made.

Wafer chamber optimization server 110 can include processor(s) 704, cache 716, memory 706, persistent storage 708, communications unit 710, input/output (I/O) interface (s) 712 and communications fabric 702. Communications fabric 702 provides communications between cache 716, memory 706, persistent storage 708, communications unit 710, and input/output (I/O) interface(s) 712. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses.

Memory 706 and persistent storage 708 are computer readable storage media. In this embodiment, memory 706 includes random access memory (RAM). In general, memory 706 can include any suitable volatile or non-volatile computer readable storage media. Cache 716 is a fast memory that enhances the performance of processor(s) 704 by holding recently accessed data, and data near recently accessed data, from memory 706.

Program instructions and data used to practice embodiments of the present invention, e.g., gas control component 111 and database 112, can be stored in persistent storage 708 for execution and/or access by one or more of the respective processor(s) 704 of wafer chamber optimization server 110 via memory 706. In this embodiment, persistent storage 708 includes a magnetic hard disk drive. Alternatively, or in addition to a magnetic hard disk drive, persistent storage 708 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices. In these examples, communications unit 710 includes one or more network interface cards. Communications unit 710 may provide communications through the use of either or both physical and wireless communications links. Gas control component 111 and database 112 may be downloaded to persistent storage 708 of wafer chamber optimization server 110 through communications unit 710.

I/O interface(s) 712 allows for input and output of data with other devices that may be connected to wafer chamber optimization server 110. For example, I/O interface(s) 712 may provide a connection to external device(s) 718 such as a keyboard, a keypad, a touch screen, a microphone, a digital camera, and/or some other suitable input device. External device(s) 718 can also include portable computer readable storage media such as, for example, thumb drives, portable optical or magnetic disks, and memory cards. Software and data used to practice embodiments of the present invention, e.g., gas control component 111 and database 112 on wafer chamber optimization server 110, can be stored on such portable computer readable storage media and can be loaded onto persistent storage 708 via I/O interface(s) 712. I/O interface(s) 712 also connect to a display 720.

Display 720 provides a mechanism to display data to a user and may be, for example, a computer monitor or the lenses of a head mounted display. Display 720 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for optimizing atomic layer etching (ALE) and atomic layer deposition (ALD), the method comprising:
charging a first wafer chamber with a first gas from a first storage tank for a first cycle run;
determining whether the first cycle run has completed;
responsive to the first cycle run completing, transferring the first gas from the first wafer chamber to a second wafer chamber and charging the first wafer chamber with a second gas from a second storage tank for a second cycle run;
determining whether the second cycle run has completed;
responsive to the second cycle run completing, transferring the first gas from the second wafer chamber to the first storage tank and routing the second gas from the first wafer chamber to the second wafer chamber for a third cycle run;
determining whether the third cycle run has completed; and
responsive to the third cycle run completing, transferring the second gas from the second wafer chamber to the second storage tank.

2. The method of claim 1, wherein the first gas further comprises a precursor gas and an oxidizer gas.

3. The method of claim 1, wherein the first wafer chamber is identical to the second wafer chamber.

4. The method of claim 1, wherein the second gas further comprises a deposition gas.

5. The method of claim 2, wherein the precursor gas further comprises of $TiCl_4$.

6. The method of claim 2, wherein the oxidizer gas further comprises of $H_2O$.

7. The method of claim 4, wherein the deposition gas further comprises of $Al_2O_3$.

8. A system for optimizing atomic layer etching (ALE) and atomic layer deposition (ALD), the system comprising:
a first wafer chamber connected to a second wafer chamber;
a first storage tank connected to the first wafer and second wafer chamber by a piping system;
a second storage tank connected to the first wafer and second wafer chamber by the piping system;
the piping system further comprises a compressor, a valve and a gas sensor; and
a computer system configured to control the transferring of a first gas and second gas associated with the piping system between the first storage tank, first wafer chamber, second wafer chamber and second storage tank.

9. The system of claim 8, wherein the first gas further comprises a precursor gas and an oxidizer gas.

10. The system of claim 8, wherein the second gas further comprises a deposition gas.

11. The system of claim 9, wherein the precursor gas further comprises of $TiCl_4$.

12. The system of claim 9, wherein the oxidizer gas further comprises of $H_2O$.

13. The system of claim 10, wherein the deposition gas further comprises of $Al_2O_3$.

14. The system of claim 9, wherein the first wafer chamber is identical to the second wafer chamber.

15. A computer program product for optimizing atomic layer etching (ALE) and atomic layer deposition (ALD), the computer program product comprising:
one or more non-transitory computer readable storage media and program instructions stored on the one or more non-transitory computer readable storage media, the program instructions comprising:
program instructions to charge a first wafer chamber with a first gas from a first storage tank for a first cycle run;
program instructions to determine whether the first cycle run has completed;
responsive to the first cycle run completing, program instructions to transfer the first gas from the first wafer chamber to a second wafer chamber and charging the first wafer chamber with a second gas from a second storage tank for a second cycle run;
program instructions to determine whether the second cycle run has completed;
responsive to the second cycle run completing, program instructions to transfer the first gas from the second wafer chamber to the first storage tank and routing the second gas from the first wafer chamber to the second wafer chamber for a third cycle run;
program instructions to determine whether the third cycle run has completed; and
responsive to the third cycle run completing, program instructions to transfer the second gas from the second wafer chamber to the second storage tank.

16. The computer program product of claim 15, wherein the first gas further comprises a precursor gas and an oxidizer gas.

17. The computer program product of claim 15, wherein the first wafer chamber is identical to the second wafer chamber.

18. The computer program product of claim 15, wherein the second gas further comprises a deposition gas.

19. The computer program product of claim 16, wherein the precursor gas further comprises of $TiCl_4$.

20. The computer program product of claim 16, wherein the oxidizer gas further comprises of $H_2O$.

* * * * *